United States Patent
Taheri

(10) Patent No.: US 6,608,515 B2
(45) Date of Patent: Aug. 19, 2003

(54) BUS AGENT UTILIZING DYNAMIC BIASING CIRCUITRY TO TRANSLATE A SIGNAL TO A CORE VOLTAGE LEVEL

(75) Inventor: Babak A. Taheri, San Francisco, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/199,160

(22) Filed: Jul. 18, 2002

(65) Prior Publication Data

US 2002/0196068 A1 Dec. 26, 2002

Related U.S. Application Data

(60) Continuation of application No. 09/989,471, filed on Nov. 19, 2001, now Pat. No. 6,445,240, which is a division of application No. 09/028,194, filed on Feb. 23, 1998, now Pat. No. 6,366,159.

(51) Int. Cl.[7] ................................................ H03L 5/00
(52) U.S. Cl. ....................................................... 327/333
(58) Field of Search ................................ 327/530, 540, 327/333, 534, 537, 545, 538, 560, 73; 326/63, 33, 80

(56) References Cited

U.S. PATENT DOCUMENTS

| | | | |
|---|---|---|---|
| 5,245,230 A | 9/1993 | Ohri et al. | 307/572 |
| 5,448,198 A | 9/1995 | Toyoshima et al. | 327/530 |
| 5,461,338 A | 10/1995 | Hirayama et al. | 327/534 |
| 5,469,076 A | 11/1995 | Badyal et al. | 326/16 |
| 5,811,993 A | 9/1998 | Dennard et al. | 327/54 |
| 6,025,737 A | * 2/2000 | Patel et al. | 326/80 |
| 6,049,227 A | 4/2000 | Goetting et al. | 326/80 |
| 6,069,515 A | * 5/2000 | Singh | 327/309 |
| 6,130,556 A | * 10/2000 | Schmitt et al. | 326/81 |

OTHER PUBLICATIONS

Connor, John, et al. "Dynamic Dielectric Protection for I/O Circuits Fabricated in a 2.5V CMOS Technology Interfacing to a 3.3V LVTTL Bus," 1997 Symposium on VLSI Circuits Digest of Technical Papers, pp. 119–120.

* cited by examiner

Primary Examiner—Jeffrey Zweizig
(74) Attorney, Agent, or Firm—Jeffrey S. Draeger

(57) ABSTRACT

A dynamic feedback bias circuit. A system utilizing the dynamic bias circuit includes a first bus agent and a second bus agent. The first bus agent generates a first signal having a first voltage swing. The second bus agent has a core which operates at a core operating voltage, the core operating voltage having an amplitude less than the first voltage swing. The second bus agent has an input device which receives the first signal from the first bus agent. The input device of the second bus agent is biased by the dynamic feedback bias circuit to provide a core signal with a voltage swing approximately equal to or less than the core operating voltage.

17 Claims, 7 Drawing Sheets

BUS AGENT UTILIZING DYNAMIC BIASING CIRCUITRY TO TRANSLATE A SIGNAL TO A CORE VOLTAGE LEVEL

This is a continuation of application Ser. No. 09/989,471 filed Nov. 19, 2001, now U.S. Pat. No. 6,445,240, which is a divisional of application Ser. No. 09/028,194 filed Feb. 23, 1998, now U.S. Pat. No. 6,366,159.

BACKGROUND OF THE INVENTION

1. Field of the Invention

The present invention pertains to the field of input conditioning circuitry with dynamic biasing. More particularly, one embodiment of the present invention pertains to utilizing dynamic feedback from an input signal to reduce the input signal to within a desired voltage range.

2. Description of Related Art

Since advances in semiconductor fabrication techniques enable semiconductor manufacturers to design new and improved semiconductor devices at a fast pace, circuitry which allows such new devices to be employed in systems utilizing older semiconductor devices may be quite advantageous. If such circuitry is available, system manufacturers may be able to upgrade different components of a system without requiring a complete system redesign. One example is microprocessor technology, where microprocessors designed using new fabrication processes may be available before other components such as chipsets are manufactured on similar processes.

One major impediment to using devices fabricated on older semiconductor fabrication processes with devices fabricated on newer processes is that the operating voltage for devices fabricated using newer processes is typically lower than the operating voltages for devices fabricated on older processes. The difference in operating voltages is due, in part, to the fact that individual transistors are smaller and oxide thicknesses (e.g., gate oxides) are thinner. Typically, an electrical oxide (EOS) voltage is used to specify a voltage for a process which, if exceeded, may damage transistors. Thus, newer processes generally have lower EOS voltages than their predecessors.

While the smaller devices and thinner oxides are generally desirable since speed is typically increased and power dissipation is typically decreased, the ability to tolerate high voltages, as measured by the EOS voltage, is disadvantageously reduced. Thus, in order to use devices fabricated on new semiconductor processes in systems including older devices, it may be necessary to protect the new devices from the voltage levels at which the older devices generate signals. This protection may be accomplished by conditioning input signals (e.g., lowering their voltage levels).

In order to maintain system compatibility, prior art input signal conditioning has been done both onboard and separately from the new device. When onboard signal conditioning is used, a core portion of a device may operate at a low voltage and a periphery portion may perform the input conditioning, perhaps utilizing the core voltage and other voltage supplies. The core only receives signals approximately within the core operating voltage range, so there is no problem with EOS after signals have been conditioned in the periphery. Such onboard conditioning may allow the newer device to be plug-in compatible with older devices, meaning that little or no change is required to substitute the newer component for the older.

One prior art technique of conditioning input signals involves the use of a resistive divider circuit in conjunction with capacitors in parallel to the resistors. With a resistive divider, a "safe" voltage level (i.e., one which does not exceed the semiconductor's EOS limit) may be produced; however, the resistors and capacitors typically consume large amounts of silicon area and introduce undesirable delay characteristics. Furthermore, the resistors consume static power, which is especially undesirable in low power systems where devices fabricated on new semiconductor processes are often employed. Thus, the prior art does not provide an adequately fast and compact circuitry which can rapidly provide signals to a device core operating at a low voltage when a higher voltage signal is received.

SUMMARY

A dynamic feedback bias circuit is disclosed. A system utilizing the dynamic bias circuit includes a first bus agent and a second bus agent. The first bus agent generates a first signal having a first voltage swing. The second bus agent has a core which operates at a core operating voltage, the core operating voltage having an amplitude less than the first voltage swing. The second bus agent has an input device which receives the first signal from the first bus agent. The input device of the second bus agent is biased by the dynamic feedback bias circuit to provide a core signal with a voltage swing approximately equal to or less than the core operating voltage.

BRIEF DESCRIPTION OF THE FIGURES

The present invention is illustrated by way of example and not limitation in the figures of the accompanying drawings.

DETAILED DESCRIPTION

The present invention provides dynamic bias circuitry utilizing early voltage clamp and translinear techniques. In the following description, numerous specific details such as transistor types, voltage levels, logic partitioning, and integration choices are set forth in order to provide a more thorough understanding of the present invention. It will be appreciated, however, by one skilled in the art that the invention may be practiced without such specific details. In other instances, control structures and gate level circuits have not been shown in detail in order not to obscure the invention. Those of ordinary skill in the art, with the included descriptions, will be able to implement the necessary logic circuits without undue experimentation.

The dynamic bias circuitry of the present invention may be used in a variety of contexts. In one embodiment, the circuitry allows a bus agent having core operating voltage to interface with signals of higher voltages such as input signals for the bus agent. The circuitry of the present invention advantageously allows the use of a transistor based dynamic feedback bias circuit to bias an input device in a manner that avoids exceeding the EOS voltage of the input device. Consequently, the use of relatively large and relatively slow resistive and capacitance means of adjusting input voltage levels may be largely avoided. In addition, the use of early voltage clamping techniques in some embodiments provides a rapid response to avoid exceeding the EOS voltage of device(s) receiving the input signal.

Furthermore, the circuitry of the present invention may be fabricated using "native" devices for a particular process. A "native" device is a device which generally has substantially the same characteristics (excluding variable sizing parameters) as other devices on the same die. For example, all native devices on a die may have substantially the same gate oxide thickness or EOS tolerance because they are all fabricated using the same processing steps. Some semiconductor manufacturing processes may include specialized devices which have, for example, thicker gate oxides or other differing characteristics because special processing is used in their fabrication. While such normative devices may have desirable characteristics for applications such as input conditioning, the additional processing complexity may be a disadvantage. Thus, the present invention provides the additional advantage of being capable of performing input conditioning using only native devices which do not require special processing steps Finally, some embodiments of the present invention reduce static power consumption in comparison to an input conditioning circuits utilizing resistive dividers as done in the prior art. Reduced power consumption may be particularly advantageous in low power applications where semiconductor devices employing new, low voltage processes are often employed.

Figure 1:
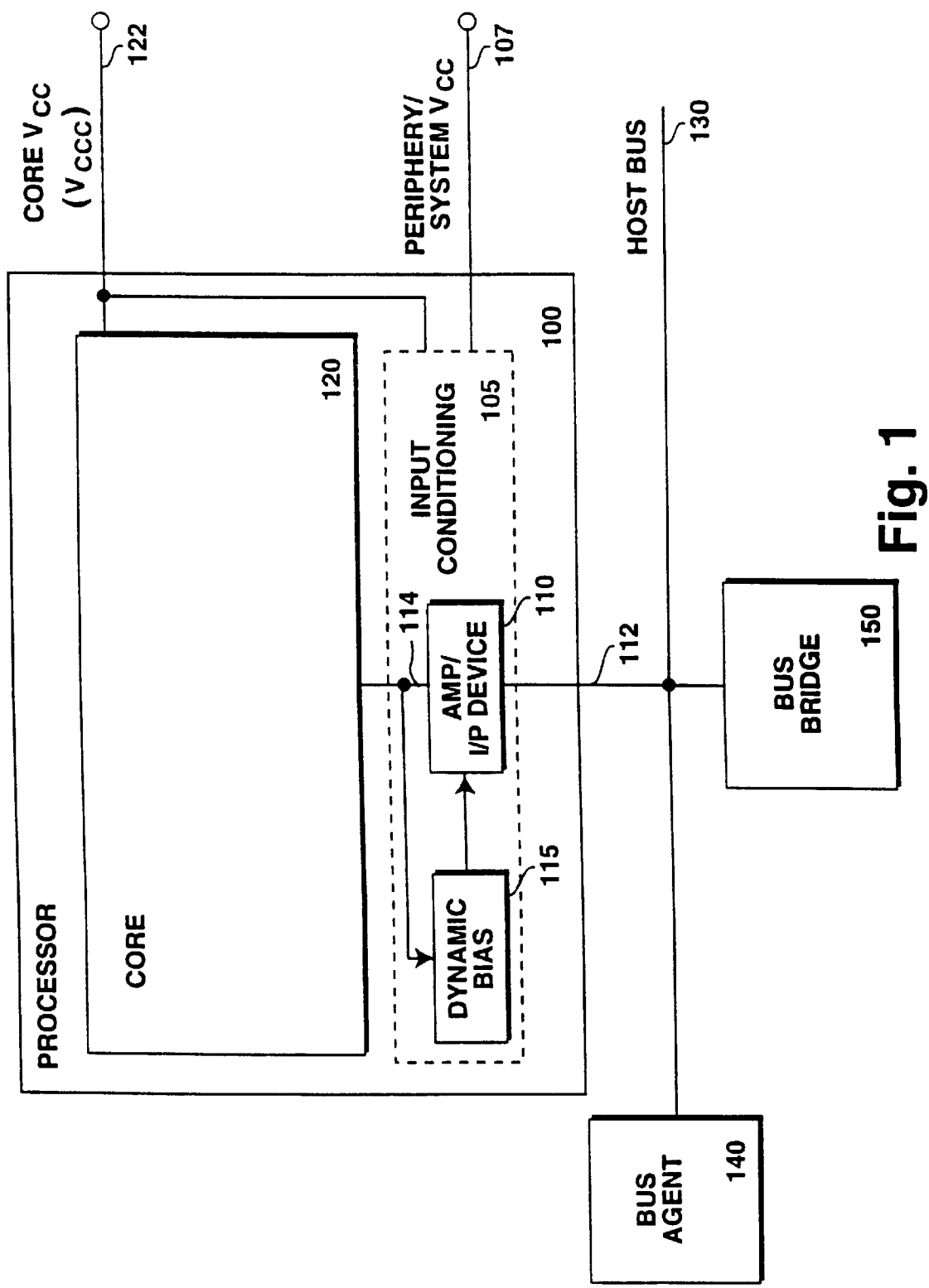
FIG. 1 illustrates one embodiment of a system of the present invention.

FIG. 1 illustrates one embodiment of a system utilizing the present invention. In this system, a processor 100 interacts with a bus agent 140 and a bus bridge 150 over a host bus 130. Other devices such as memory and peripheral devices are typically present in such a system. In this system, bus agents, such as the bus agent 140 and the bus agent 150 generate signals on the host bus having a voltage swing approximately equal to a system voltage (system Vcc).

The processor 100, on the other hand, has a processor core 120 which operates at a lower voltage (core Vcc) than the system voltage. The core Vcc (Vccc) is supplied to the core 120 on a power line 122. In some embodiments, the processor 100 may generate the core Vcc from the system Vcc utilizing on-chip circuitry. As illustrated, however, the system or periphery voltage may be supplied on a separate power line 107.

In order for the processor 100 to interact with the other bus agents, signals received on signal lines such as signal line 112 are passed through an input conditioning circuit 105 prior to reaching the core 120. The input signal from signal line 112 is received by an input device 110 such as an amplifier. The input device 110 is biased by a dynamic bias circuit 115 such that an output voltage of the input conditioning circuit 105 passed to the core 120 on a signal line 114 has a voltage swing which is approximately equal to or less than the amplitude of the core Vcc.

The output of the input conditioning circuit 105 is approximately equal to or less than the core Vcc in order to avoid applying a voltage in excess of the electrical oxide (EOS) voltage of any transistor in the core 120. Accordingly, a voltage which is approximately equal to or less than the core voltage is within the range of voltages that can be processed by the core circuitry. It may be less than the typical core voltage swing as transistors are often quite effective at switching in response to input voltages in a range with an amplitude less than their full operating voltage. Additionally, circuits such as differential amplifiers may be utilized to increase voltage swings if they are too low for core circuitry. On the other hand, voltages input to the core may be equal to or slightly greater than core voltage without exceeding the electrical oxide (EOS) limit of core circuitry. Similarly, transient signal artifacts on signal line 114 may temporarily exceed the core voltage without maintaining a high enough voltage for a long enough duration to cause electrical oxide (EOS) damage.

Thus, the input conditioning circuit can shield the core 120 from electrical oxide (EOS) damage by providing to the core an output voltage which is, when viewed as a whole, approximately equal to or less than the core voltage. Further details of the input conditioning circuit 105 in one embodiment of the present invention are illustrated in FIG. 2.

Figure 2:
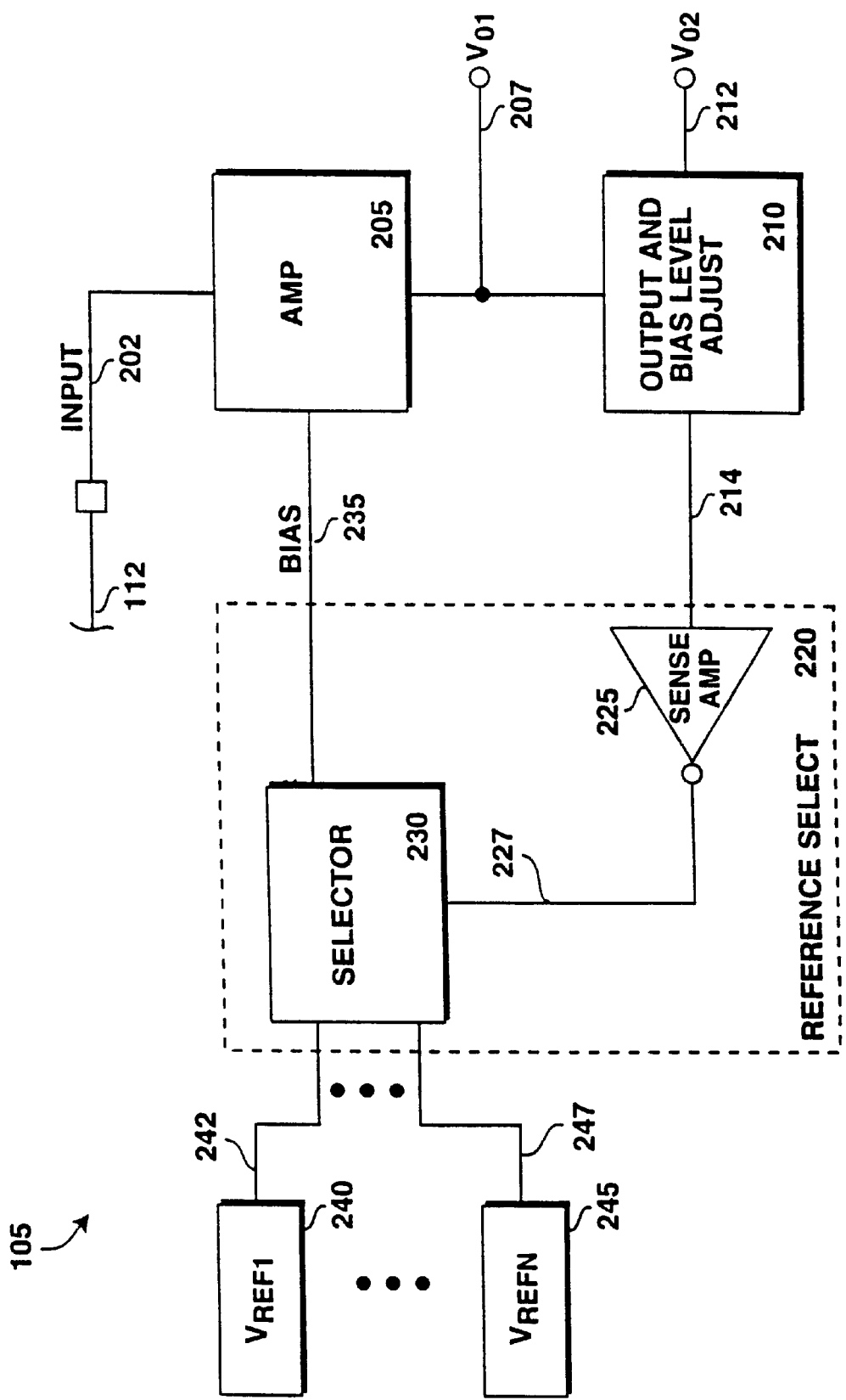
FIG. 2 illustrates one embodiment of the input conditioning circuit 105 shown in FIG. 1.

In the embodiment of FIG. 2, an input signal is received on an input line 202 from the signal line 112 which is connected to the host bus 130 in FIG. 1. An amplifier 205 having a gain of less than or equal to 1 is employed as the input device which receives the input signal. The amplifier is also coupled to receive a bias voltage from a bias line 235 and is coupled to produce a first output voltage (Vo1) on a signal line 207. The output voltage produced at Vo1 reflects the input voltage except that the input voltage may be attenuated or clamped at certain voltage levels to maintain a voltage low enough to avoid electrical oxide of core circuitry.

An output and bias level adjust circuit 210 is coupled to receive the output voltage at Vo1 and to generate a second output voltage (Vo2) on a signal line 212. The output and bias level adjust circuit 210 generally adjusts and typically reduces the output voltage at Vo1 for a feedback loop. A lower voltage signal reflecting the input signal may be desirable for use in the dynamic feedback loop in addition to the potential use of Vo2 in the core. As illustrated, the output and bias level adjust circuit 210 produces an adjusted signal on a signal line 214. The adjusted signal is adjusted in voltage level from the output voltage on signal line 207 but is still reflective of the input signal received on signal line 202. The output bias and level adjust circuit 210 is not necessary in embodiments where subsequent stages in the dynamic feedback loop can accept the output signal generated by the amplifier 205.

In the illustrated embodiment, a reference select circuit 220 receives the adjusted signal from the output and bias level adjust circuit 210 and according to that signal selects one or more of n voltage supplies (Vref1–Vrefn) to assist in biasing the bias line 235. Since the adjusted signal on signal line 214 reflects the input signal, the reference select circuit 220 biases the bias line 235 in response to the input signal. This dynamic feedback bias loop allows the input conditioning circuit 105 to avoid a voltage in excess of the EOS voltage being applied to the amplifier 205.

The reference select circuit 220 includes a sense amp 225 coupled to receive the adjusted signal and a selector circuit coupled to select the output of one or more voltage supplies.

The sense amp 225 generates a reference select signal or signals over the signal line(s) 227. The reference select signal allows the selector 230 to select the appropriate voltage reference source. As illustrated, each of the voltage reference circuits provides a reference voltage at a reference voltage output. For example, a first reference voltage (Vref1) 240 produces a first reference voltage on a first reference voltage output 242. Similarly, a last voltage reference circuit (Vrefn) 245 produces a references voltage at the voltage reference output 247.

Thus, the input conditioning circuit of FIG. 2 illustrates the use of a dynamic feedback bias circuit to select one or more of a plurality of voltage supplies to bias an input device such as the amplifier 205. As previously noted, such a circuit may be used to condition input signals in order to avoid EOS of subsequent circuitry. Additionally, such circuitry may be useful in other applications. For example, in an embodiment where the reference select circuit 220 selects one of n bias voltages, the bias voltage on the bias line 235 provides a digitized version of the input signal. As discussed further with respect to FIG. 6, such a circuit may be useful in a high-speed analog-to-digital converter. Additionally, the dynamic feedback bias circuit may be used to bias any type of amplifier which may be substituted for the amplifier 205.

Figure 3:
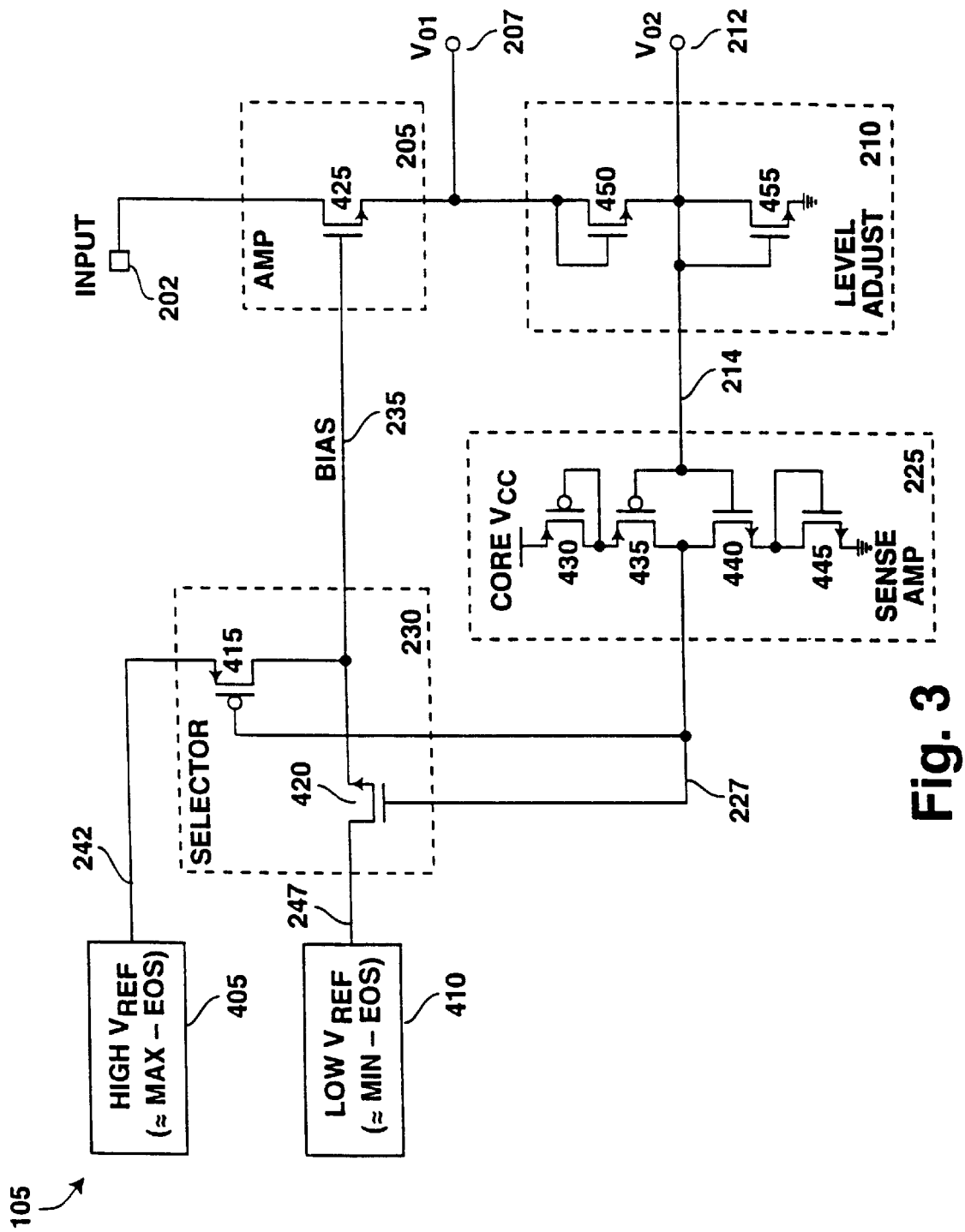
FIG. 3 illustrates another embodiment of the input conditioning circuit 105 of FIG. 1.

FIG. 3 illustrates an embodiment of the input conditioning circuit 105 which is particularly useful in avoiding EOS of subsequent circuitry. In this embodiment one of two voltage reference sources is selected by the selector 230 to bias the amplifier 205 in a manner avoiding EOS of that circuit. The amplifier 205 is formed by a n-channel transistor 425 connected in a common gate amplifier arrangement. The transistor source is coupled to the signal line 207, the gate to the bias line 235, and the drain to the signal line 202 which is coupled to receive the input signal.

In this embodiment, the level adjust circuit 210 is formed by a pair of n-channel transistors 450 and 455 which have their gate and drain terminals connected together. In this arrangement, the dynamic range of the second output voltage (Vo2) is less than that of Vo1. The second output voltage is also passed to the sense amplifier 225 on the signal line 214.

The sense amplifier 225 is designed to switch its output signal in response to fairly limited changes in its input. A p-channel transistor 430 having its source connected to the core Vcc and its gate and drain terminals connected together in conjunction with an n-channel transistor 445 having its source connected to a ground terminal and its gate and drain terminals connected together limit the operating range of an inverter effectively formed by a p-channel transistor 435 and an n-channel transistor 440. The transistors 435 and 440 have their gates coupled to receive the adjusted signal on signal line 214; however, the transistors 430 and 445 limit the operating range of this inverter structure to approximately two diode drops less than the amplitude of the core operating voltage.

In this embodiment, the sense amp 225 provides a single reference select signal on the signal line 227 to the selector circuit 230. The selector circuit 230 selectably couples either or both of a high voltage reference circuit 405 and a low voltage reference circuit 410 to the bias line 235. If the reference select signal is at a high logical level, a transistor 420 connected as a pass gate between low voltage reference circuit 410 and the bias line 235 is enabled, thus biasing the bias line at the voltage of the low voltage reference circuit 410. Thus, a low voltage value of the input signal on signal line 202 causes a low bias voltage to be applied to the bias line 235. Since the output voltage of the low voltage reference circuit 410 is approximately the minimum expected voltage of the input signal plus the EOS voltage for the circuit, this biasing ensures that the EOS limit is not exceeded for the transistor 425.

Similarly, if the input signal on signal line 202 is at a high signal level, the reference select signal on signal line 227 is driven to a low voltage value. This enables a transistor 415 which is connected as a pass gate between the high voltage reference circuit 405 and the bias line 235. Since the output voltage of the high voltage reference circuit 405 is approximately the maximum expected input voltage less the EOS voltage for the circuit, this biasing ensures that a high input voltage will also not damage the transistor 425. Thus, by selectably coupling one of the two voltage reference circuits to bias the input device, transistor 425, the dynamic feedback bias circuit avoids EOS damage to the input device.

Figure 4A:
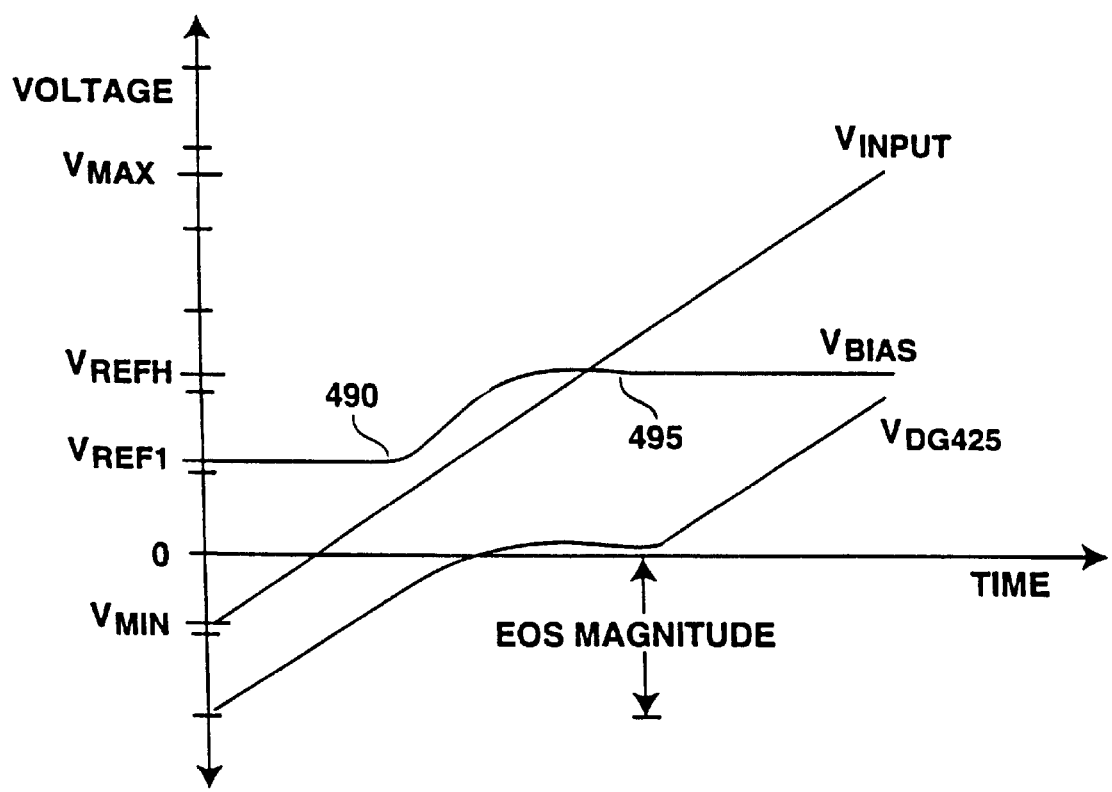
FIG. 4A illustrates one way the bias voltage may be developed by the dynamic bias circuit and the resulting voltage across an input device according to one embodiment of the present invention when an input voltage varying in time from a minimum expected voltage (Vmin) to a maximum expected voltage (Vmax) is applied.
Figure 4B:
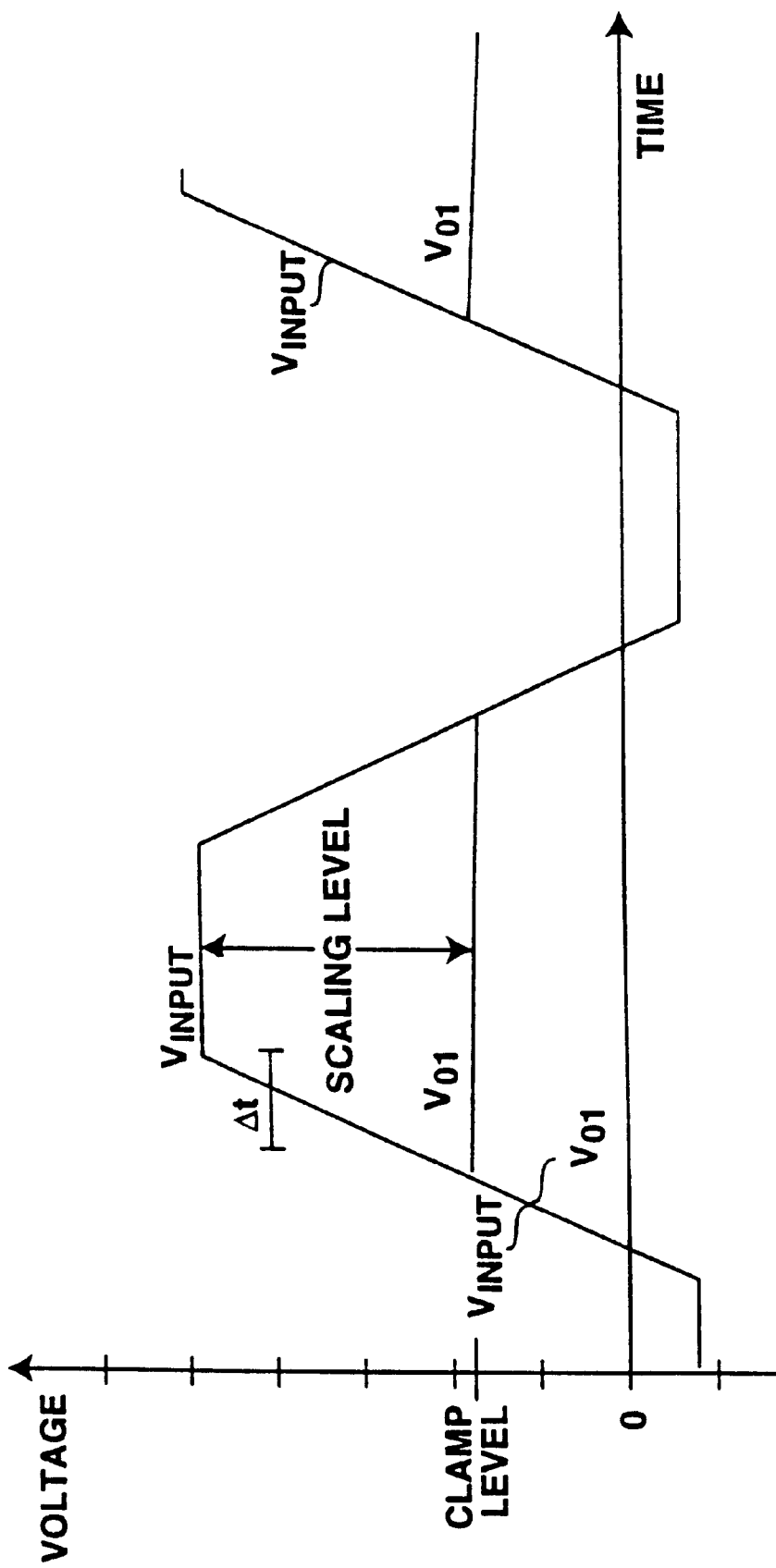
FIG. 4B illustrates the output voltage (Vo1) generated by one embodiment of the present invention when an input voltage (Vin) is applied.

FIGS. 4a and 4b illustrate the operation of one embodiment of the input conditioning circuit 105. In FIG. 4a, a voltage labeled Vinput ranging from a minimum expected input voltage (Vmin) to a maximum expected input voltage (Vmax) is applied to an input of one embodiment of the input conditioning circuit 105 on signal line 202. FIG. 4a illustrates the resulting bias voltage on the bias line 235 (labeled Vbias) and the drain-to-gate voltage of the transistor 425 (labeled Vdg425).

Initially, the bias voltage begins at the voltage output level of the low voltage reference circuit 410 (Vref1) because the input signal being low results in the reference select signal on signal line 225 enabling transistor 420. As the input voltage increases, the sense amp eventually begins to drive the reference select signal on signal line 227 to a low voltage value, thereby disabling the transistor 420 and beginning to enable the transistor 415.

A first breakpoint 490 is shown in FIG. 4a indicating when the transistor 420 first begins to shut off and the transistor 415 first begins to conduct. A second breakpoint labeled 495 indicates a point where the transistor 415 is enabled, the transistor 420 is disabled, and the high voltage reference circuit biases the bias line 235 with its output voltage (Vrefh). This type of biasing is referred to as translinear because the linear response from breakpoint 490 to 495 is interrupted on both sides by fixed voltage reference circuits which change the response characteristic. With this definition, many biasing schemes which selectably couple multiple voltage references to create a bias voltage would qualify as being translinear biasing circuits.

As a result of the bias applied to the transistor 425, the voltage applied to the transistor 425 does not exceed the EOS voltage of that device. The biasing circuit achieves this despite the fact that the input voltage range is more than twice the EOS voltage.

FIG. 4b illustrates the output of one embodiment of the input conditioning circuit 105 generated in response to an input voltage which transitions from Vmin to Vmax and back again. As illustrated, the output voltage (Vo1) is scaled by clamping Vinput at a clamp level early in the transition between Vmin and Vmax. This early clamp technique not only allows EOS problems to be avoided in circuitry receiving the output voltage, but also provide the output voltage transition very rapidly. For example, as indicated in FIG. 4b the time Δt indicates the difference in time between when the output voltage achieves its maximum voltage and when the input voltage achieves its maximum voltage.

As can be clearly seen, using this early voltage clamp technique, the output voltage has fully transitioned before the input voltage Vo1 has completed its transition. Thus, the input conditioning circuit 105 may effectively have a negative propagation delay if delays are measured using a certain percentage of the expected total voltage transition (e.g., the 50% point) as the measuring point. Regardless of the exact propagation delay measurement, the input conditioning circuit 105 provides very rapid input conditioning since as little as one transistor (transistor 425) separates the input from the output. As to the downward transition of input voltage, no such potentially negative propagation delay occurs in this embodiment; however, the output voltage closely tracks the input voltage after the input voltage falls below the high reference voltage.

In addition to the high speed of the input conditioning circuit being beneficial to circuits receiving the output voltage, the low delay through the feedback loop is also important in allowing the bias voltage to be adjusted in time to avoid EOS of the input device, transistor 425. The rapid feedback allows the bias to be adjusted before an EOS violation can occur. Thus, the small delay between input and output and the relatively short feedback path are both advantageous for a circuit using a dynamic feedback biasing to perform input conditioning.

Figure 5:
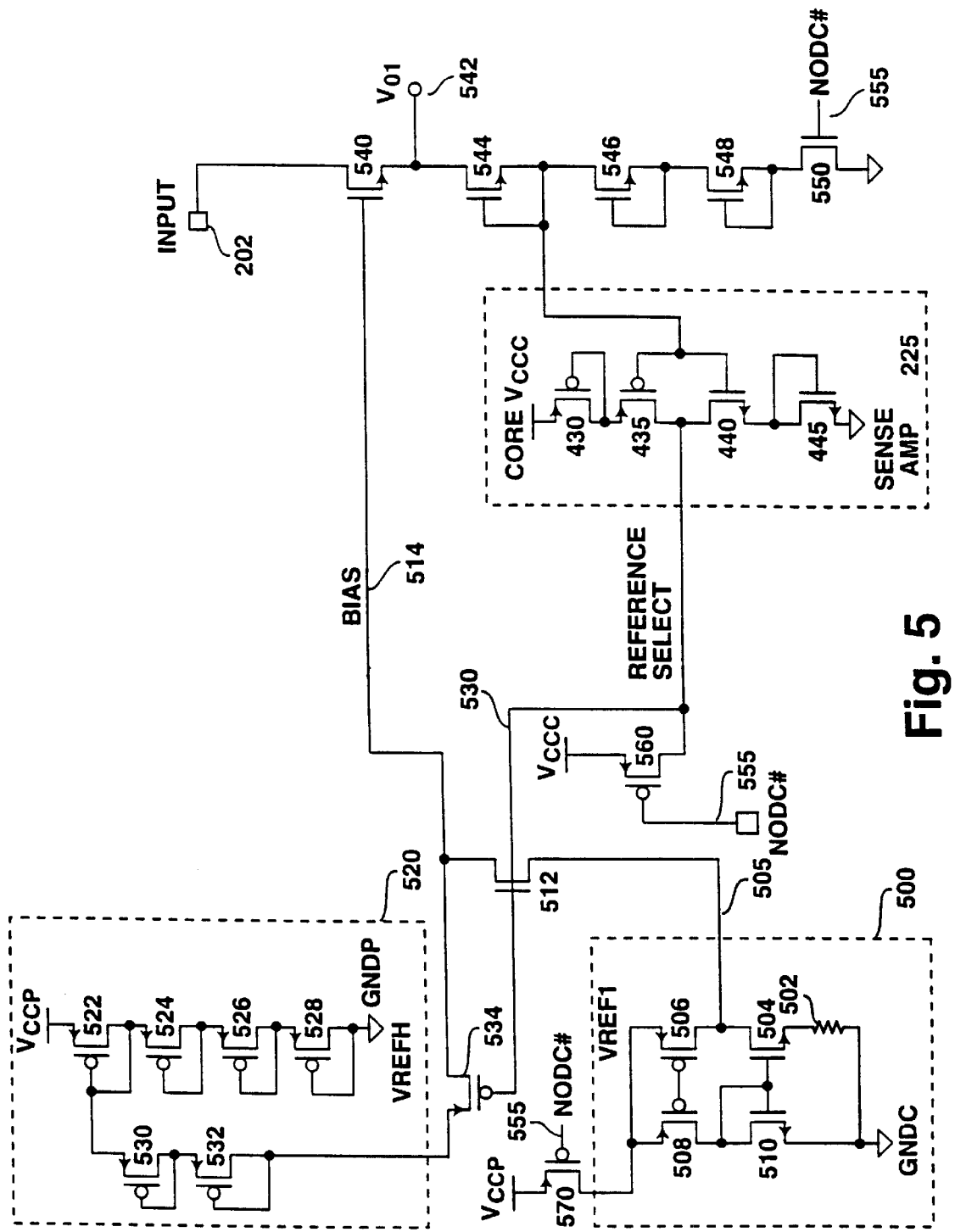
FIG. 5 illustrates additional details of voltage reference sources and static current prevention devices of one embodiment of the input conditioning circuit of the present invention.

FIG. 5 illustrates details of a high voltage reference source 520 and a low voltage reference circuit 500 used in one embodiment. Additionally, FIG. 5 details the use of transistors 550 and 560 to eliminate DC signal paths when a NODC# signal is applied on the signal line 555.

In the embodiment of FIG. 5, a transistor 540 forms the input device which receives the input signal from signal line 202 and is biased by a bias line 514. The output of this input conditioning circuit (Vo1) is generated on the signal line 542. Three transistors, transistors 544, 546, and 548 are connected in series in diode fashion each having its gate connected to its source. Below the three transistors, transistors 544, 546, and 548, a transistor 550 allows this input stack to be disconnected from the ground terminal when a NODC# signal is asserted on the signal line 555. Similarly, a transistor 570 disconnects the first voltage reference 500 from Vccc when the NODC# signal is asserted.

The input for the sense amp 225 is taken from the source of the top transistor 544, thereby providing a larger voltage swing to the sense amp 225 than would be available from the source of either transistor 546 or 548. As illustrated, the sense amp 225 is configured with transistors 430–445 as previously shown in FIG. 3. In this embodiment, the sense amp 225 is powered by the core Vcc signal (Vccc), and the ground accordingly is the core ground (GNDc).

The sense amp 225 generates the reference select signal on signal line 530 which, as previously discussed, selectably couples the high and low voltage reference circuits 520 and 500 to the bias line 514. New to this embodiment is the transistor 560 which drives the reference select signal to the core voltage value when the NODC# signal is asserted on signal line 555. This prevents the output node of the sense amp 225 from floating and creating a DC path through the sense amp 225.

In this embodiment, the low voltage reference circuit 500 is a current mirror based circuit which provides a low variation output voltage on signal line 505 which does not fluctuate with changes in the core Vcc. The low voltage reference circuit 500 includes two p-channel transistors 506 and 508, each having its source connected to the core Vcc. The gate terminals of transistors 506 and 508 are connected together. The drain of the transistor 506 provides the output voltage on signal line 505 and is attached to the drain of a n-channel transistor 504. The source of the n-channel transistor 504 is connected to the core ground signal via a resistor 502. Another n-channel transistor 510 has its source connected to the core ground signal and has its gate attached to the gate of the transistor 504. Additionally, the drain of transistor 510 is connected to the gates of transistors 504 and 510 as well as the drain of transistor 508. This arrangement provides a low variation output voltage on signal line 505 despite fluctuations on Vccc as long as the width to length ratios of transistors 506 and 508 are equal and the width to length ratio of transistor 504 is greater than that of transistor 510. Under such conditions, the voltage on signal line 505 is a function of the gate-to-source voltages of transistors 504 and 510 as well as the value of the resistor 502.

The high voltage reference circuit 520 includes two stacks of series p-channel transistors connected in diode fashion. The source of transistor 522 is connected to the peripheral voltage supply line (Vccp). The gate of transistor 522 is connected to the drain of transistor 522, and transistors 524, 526, and 528 are likewise connected in series with their gates connected to their drains and the last transistor, transistor 528 having its drain connected to the periphery ground signal GNDp. The transistor 531 has its source connected to the gate of transistor 522 and its gate connected to its drain. Likewise, transistor 532 has its source connected to the drain of transistor 531 and its gate and drain terminals connected. At the drain terminal of transistor 532, the high voltage reference circuit 520 provides the output voltage which is driven onto the bias line 514 as the pass transistor 534 is enabled by the reference select signal.

Notably, in this arrangement, the transistor 534 may remain biased such that it is weakly on when the reference select signal is at its high voltage level and may therefore cause some contention with the low voltage reference circuit 500. Keeping the transistor 534 weakly on preserves the bias voltage of the high voltage reference circuit 520 and also helps reduce transient effects which may otherwise impact the bias voltage. The transistor 512, however, should be sized such that when transistor 512 is enabled, the low voltage reference circuit 500 strongly dominates and the bias voltage is pulled low. Thus, in the embodiment of FIG. 5, each voltage supply dominates in a particular voltage range which causes its pass transistor to be strongly enabled.

In one embodiment, the periphery voltage is 3.3V, the core voltage is 2.0V, and the electrical oxide voltage is approximately 2V. In this embodiment, the output of the low voltage reference circuit 500 is approximately 1.3V, and the output of the high voltage reference circuit 520 is approximately 2.3V. With an expected minimum input voltage of −0.7V and an expected maximum input voltage of 4.3V, the circuit in FIG. 5 prevents the EOS voltage from being exceeded for any of these devices.

In alternate embodiments, larger or smaller voltages may be tolerated. In an application having a larger difference between the core Vcc and the amplitude of the difference between the expected minimum and maximum voltages, a traditional voltage level shifter may be used in place of the sense amp 225 to avoid EOS problems in devices of the reference select circuitry.

Additionally, it may be advantageous to include capacitor circuits at certain points in the embodiments of FIG. 5. For example, to place capacitors between the bias line 514 and ground, between the bias line 514 and signal line 542 (Vo1), between Vccc and the output of the low voltage reference circuit 500 (line 505), between GNDc and line 505, and between Vccc and GNDc in the voltage reference circuit 500.

Figure 6:
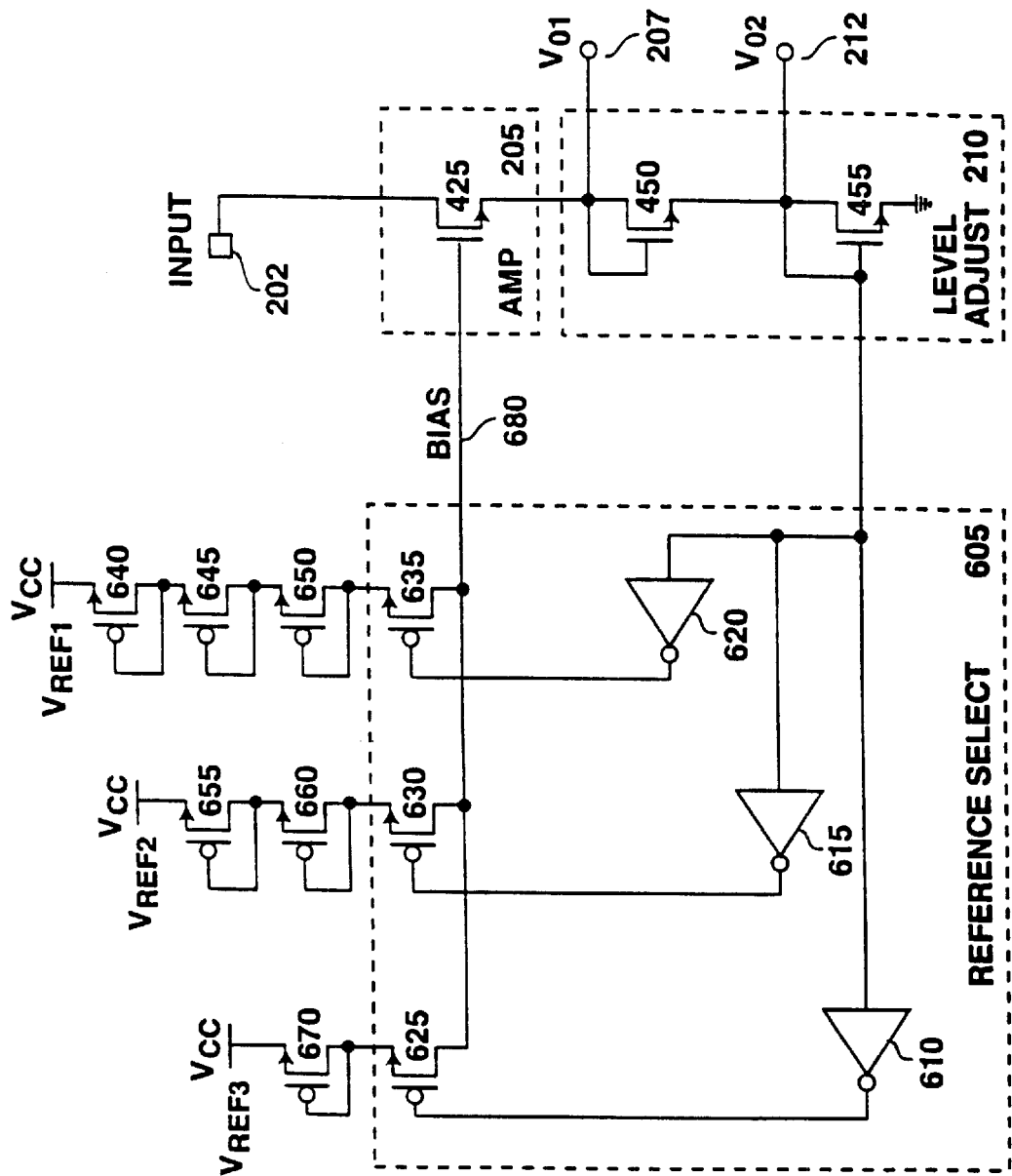
FIG. 6 illustrates an alternative embodiment of an input conditioning circuit of the present invention.

FIG. 6 illustrates one alternate embodiment of a dynamic feedback bias circuit. This circuit utilizes translinear techniques involving three voltages reference circuits. Such a circuit may be useful in analog-to-digital conversion. In FIG. 6, the input signal is again received on a signal line 202 and then passed to an amp 205 consisting of a transistor 425. Again, the level adjust circuit 210 as discussed previously with respect to FIG. 3 is used.

FIG. 6, however, employs a reference select circuit 605 which differs from those previously shown. The reference select circuit 605 includes three inverters, inverter 610, 615, and 620, which take as their input the Vo2 signal from the level adjust circuit 210. The output of these three inverters respectively are coupled to the gates of three pass gates 625, 630, and 635. The pass gates are p-channel transistors, therefore are generally enabled as a low voltage is applied to their gates.

The first voltage reference circuit is a series combination of three p-channel transistors, transistors 640, 645, and 650 which are connected in series between Vcc and the source of the pass gate 635. Each of the transistors 640, 645, and 650 is connected with its gate coupled to its drain.

Similarly, the second voltage source includes two series p-channel transistors 655 and 660 connected between Vcc and the source of the pass transistor 630. Transistors 655 and 660 are also connected in diode fashion with their gates coupled to their drains. Finally, the third voltage source is a single transistor 670 having its source connected to Vcc and its gate and drain connected to the source of pass transistor 625.

As an increasing input voltage is applied, the voltage at Vo2 increases, thereby causing the voltages at the output of inverters 610, 615, and 620 to decrease. Since the source of the pass gate 625 is closest to Vcc, any drop in the voltage of the gate 625 provides a larger gate to source voltage at the gate of transistor 625 than would be present at either of transistors 630 and 635. Thus, at a first and lowest voltage level of the input signal, Vref3 will bias the transistor 425 via bias line 680. At a higher voltage, the gate-to-source voltage of transistor 630 will be sufficient to also enable that transistor, thereby also coupling the second voltage reference circuit to the bias line 680. Similarly, at a third voltage level of the input signal, the transistor 635 will be enabled thereby creating a third step in the voltage on the bias line 680.

In effect, therefore, the bias line 680 provides a digitized version of the input signal. In other words, the bias voltage (Vbias) shown in FIG. 4a for this circuit would have three discreet steps. Additional voltage reference circuits could be added if additional steps of digitization are necessary; however, this circuit demonstrates how a dynamic feedback bias may be used to create a fast analog-to-digital converter.

Thus, the present invention provides dynamic bias circuitry which may be used in a variety of contexts. While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art upon studying this disclosure.

What is claimed is:

1. A bus agent comprising:
   an input device coupled to receive a first signal having a first voltage swing;
   a core coupled to operate at a core operating voltage with an amplitude less than the first voltage swing;
   a dynamic feedback bias circuit to provide a bias for the input device from a plurality of bias voltages and to bias the input device to provide a core signal to the core having a second voltage swing approximately equal to or less than the core operating voltage.

2. The bus agent of claim 1 wherein the dynamic feedback bias circuit is coupled to bias the input device to avoid exceeding an electrical oxide voltage of the input device.

3. The bus agent of claim 1 wherein the dynamic feedback bias circuit is a translinear dynamic feedback bias circuit.

4. The bus agent of claim 3 wherein the input device and dynamic feedback bias circuit utilize only transistors that are native devices used throughout the second bus agent.

5. The bus agent of claim 1 wherein the input device and dynamic feedback bias circuit utilize only transistors that have substantially the same electrical oxide voltage as other transistors in the second bus agent.

6. The bus agent of claim 1 wherein the dynamic feedback bias circuit comprises:
   a plurality of voltage reference circuits each having one of a plurality of voltage reference outputs; and
   a reference select circuit coupled to bias the input device by enabling at least one device coupling at least one of the plurality of voltage reference outputs to a bias input of the input device, the reference select circuit being coupled to select the at least one of the plurality of voltage reference outputs in response to the first signal.

7. The bus agent of claim 6 wherein the plurality of voltage reference circuits comprise a first voltage reference circuit and a second voltage reference circuit having an output voltage lower than the first voltage reference circuit and wherein the reference select circuit is coupled to select the first voltage reference circuit to bias the input device if the first signal exceeds a first voltage level and is coupled to select the second voltage reference circuit if the first signal is less than the first voltage level.

8. The bus agent of claim 1 wherein said bus agent is a microprocessor bus agent.

9. A method comprising:
   receiving a first signal from a bus, the first signal having a first voltage swing, the first signal having a first transition;
   biasing an input device to have a first bias voltage during a first portion of the first transition and to have a second bias voltage during a second portion of the first transition.

10. The method of claim 9 wherein said first bias voltage and said second bias voltage limit a voltage applied across said input device to less than a selected value.

11. The method of claim 10 wherein said selected value is an electrical oxide stress voltage.

12. The method of claim 9 further comprising:
   generating a core signal reflective of said first signal, said core signal having a core voltage swing which is less than said first voltage swing.

13. The method of claim 10 further comprising:
   generating a core signal reflective of said first signal, said core signal having a core voltage swing which is less than said first voltage swing.

14. The method of claim 9 wherein biasing comprises:
   strongly enabling a first gate coupling a first voltage supply to bias the input device when the first signal is at a high signal level;
   strongly enabling a second gate coupling a second voltage supply to bias the input device when the first signal is at a low level; and weakly enabling the first gate when the first signal is at the low level.

15. A bus agent comprising:

a biased input circuit to receive a first signal having a first transition from a first voltage level to a second voltage level, the biased input circuit to receive a first bias voltage during a first portion of the first transition and to receive a second bias voltage during a second portion of the first transition, the biased input circuit to output a core voltage level signal reflective of the first signal;

a core operative at a core voltage level less than a magnitude of a difference between the second voltage level and the first voltage level.

16. The bus agent of claim 15 further comprising:

a first voltage reference circuit to generate the first bias voltage;

a second voltage reference circuit to generate the second bias voltage, the second bias voltage having a smaller magnitude than the first bias voltage;

a reference select circuit to select the first voltage reference circuit to bias the biased input circuit when the first signal exceeds a bias transition voltage level and to select the second voltage reference circuit to bias the biased input circuit when the first signal is less than the bias transition voltage level.

17. The bus agent of claim 16 wherein said biased input circuit comprises:

a biased input device;

a sense amp coupled to a biased input device output, said sense amp to generate a signal reflective of the first signal with a voltage swing less than or equal to the core voltage.

* * * * *

UNITED STATES PATENT AND TRADEMARK OFFICE
CERTIFICATE OF CORRECTION

PATENT NO. : 6,608,515 B2
DATED : August 19, 2003
INVENTOR(S) : Taheri

It is certified that error appears in the above-identified patent and that said Letters Patent is hereby corrected as shown below:

<u>Column 3,</u>
Line 28, delete "normative" and insert -- non-native --.

Signed and Sealed this

Second Day of December, 2003

JAMES E. ROGAN
*Director of the United States Patent and Trademark Office*